United States Patent
Luong et al.

(10) Patent No.: US 8,334,083 B2
(45) Date of Patent: Dec. 18, 2012

(54) ETCH PROCESS FOR CONTROLLING PATTERN CD AND INTEGRITY IN MULTI-LAYER MASKS

(75) Inventors: Vinh Hoang Luong, Boise, ID (US); Akiteru Ko, Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 168 days.

(21) Appl. No.: 13/053,215

(22) Filed: Mar. 22, 2011

(65) Prior Publication Data
US 2012/0244458 A1 Sep. 27, 2012

(51) Int. Cl.
*G03F 1/50* (2012.01)
*G03F 1/54* (2012.01)
*G03F 7/00* (2006.01)

(52) U.S. Cl. ............... 430/5; 430/30; 430/322; 430/323
(58) Field of Classification Search ................ 430/5, 30, 430/322, 323; 216/47, 58, 67
See application file for complete search history.

(56) References Cited

U.S. PATENT DOCUMENTS

| | | |
|---|---|---|
| 6,350,390 B1 | 2/2002 | Liu et al. |
| 6,893,975 B1 | 5/2005 | Yue et al. |
| 7,354,847 B2 | 4/2008 | Chan et al. |
| 7,754,591 B2 | 7/2010 | Jung |
| 2003/0186137 A1* | 10/2003 | Chan .................................. 430/5 |
| 2008/0014533 A1 | 1/2008 | Keller et al. |
| 2009/0047789 A1 | 2/2009 | Jung |
| 2009/0194503 A1 | 8/2009 | Ko et al. |
| 2010/0170871 A1 | 7/2010 | Sone et al. |
| 2011/0039416 A1 | 2/2011 | Cole et al. |

FOREIGN PATENT DOCUMENTS
WO 2010110878 A1 9/2010

OTHER PUBLICATIONS

European Patent Office, International Search Report and Written Opinion issued in corresponding Application PCT/S2012/029767 dated Sep. 24, 2012, 12 pp.

* cited by examiner

*Primary Examiner* — Stephen Rosasco
(74) *Attorney, Agent, or Firm* — Wood, Herron & Evans, LLP

(57) ABSTRACT

A method of patterning a multi-layer mask is described. The method includes preparing a multi-layer mask on a substrate, wherein the multi-layer mask includes a lithographic layer and an intermediate mask layer underlying the lithographic layer, and wherein the intermediate mask layer comprises a carbon-containing compound. The method further includes: establishing an etch process recipe for transferring a pattern, that is formed in the lithographic layer and characterized by an initial pattern critical dimension (CD), to the intermediate mask layer; establishing at least one parametric relationship between an intermediate pattern CD to be formed in the intermediate mask layer and at least one process parameter, wherein the at least one parametric relationship provides process conditions capable of increasing and decreasing the initial pattern CD to the intermediate pattern CD; selecting a target process condition to achieve a target CD adjustment between the initial pattern CD and the intermediate pattern CD; and transferring the pattern from the lithographic layer to the intermediate mask layer using the target process condition.

20 Claims, 13 Drawing Sheets

500
ETCH PROCESS FOR CONTROLLING PATTERN CD AND INTEGRITY IN MULTI-LAYER MASKS

BACKGROUND OF THE INVENTION

1. Field of Invention

The invention relates to a method for pattern etching a multi-layer mask.

2. Description of Related Art

Typically, during fabrication of integrated circuits (ICs), semiconductor production equipment utilize a (dry) plasma etch process to remove or etch material along fine lines or within vias or contacts patterned on a semiconductor substrate. The success of the plasma etch process requires an etch chemistry including chemical reactants suitable for selectively etching one material while substantially not etching another material.

For example, on a semiconductor substrate, a pattern formed in a multi-layer mask can be transferred to an underlying layer of a selected material utilizing a plasma etching process. The multi-layer mask may include a lithographic layer, such as a photo-resist layer, having a pattern formed therein using a lithographic process. The multi-layer mask may further include one or more additional mask layers underlying the lithographic layer, such as an anti-reflective coating (ARC), an organic planarization layer (OPL), an organic dielectric layer (ODL), etc., wherein the pattern formed in the lithographic layer is subsequently transferred to the one or more additional mask layers via a sequence of etching steps.

During the transfer of the pattern from the lithographic layer to the one or more additional mask layers, it is desirable to control the critical dimension (CD) of the pattern, as well as maintain and/or improve the pattern integrity (e.g., line edge roughness (LER), line width roughness (LWR), etc.). Additionally, it is desirable to controllably achieve a uniform distribution of the CD/pattern integrity across the substrate. Furthermore, it is desirable to controllably achieve the same CD/pattern integrity for both nested (closely spaced) structures and isolated (widely spaced) structures. While etch chemistries exist for trimming CD, there still exists the need for an etch process capable of both adding and subtracting CD when patterning a multi-layer mask.

SUMMARY OF THE INVENTION

The invention relates to a method for patterning a multi-layer mask. The invention further relates to a method for pattern etching a carbon-containing layer and, in particular, an etch process for controlling critical dimension (CD) and pattern integrity when patterning a multi-layer mask including a carbon-containing layer.

According to one embodiment, a method of patterning a multi-layer mask is described. The method includes preparing a multi-layer mask on a substrate, wherein the multi-layer mask includes a lithographic layer and an intermediate mask layer underlying the lithographic layer, and wherein the intermediate mask layer comprises a carbon-containing compound. The method further includes: establishing an etch process recipe for transferring a pattern, that is formed in the lithographic layer and characterized by a initial pattern critical dimension (CD), to the intermediate mask layer; establishing at least one parametric relationship between an intermediate pattern CD to be formed in the intermediate mask layer and at least one process parameter, wherein the at least one parametric relationship provides process conditions capable of increasing and decreasing the initial pattern CD to the intermediate pattern CD; selecting a target process condition to achieve a target CD adjustment between the initial pattern CD and the intermediate pattern CD; and transferring the pattern from the lithographic layer to the intermediate mask layer using the target process condition.

According to another embodiment, the etch process recipe includes plasma formation using a process composition containing a bromine-containing gas, an oxygen-containing gas, and an optional noble gas.

DETAILED DESCRIPTION OF SEVERAL EMBODIMENTS

Figure 1A:
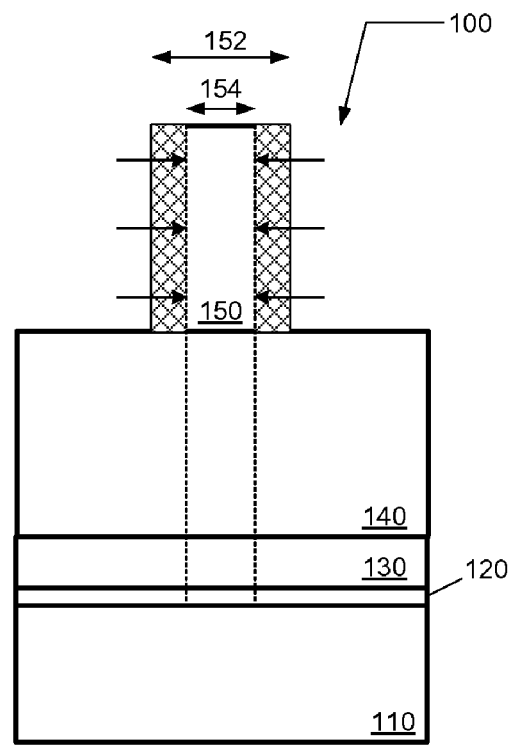
FIGS. 1A and 1B provide exemplary uses for a multi-layer mask on a substrate according to various embodiments.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

As described above in material processing methodologies, plasma is often utilized to create and assist surface chemistry on a substrate to facilitate the removal of material from the substrate or to facilitate film forming reactions for depositing material on the substrate. During the etching of a substrate, plasma may be utilized to create reactive chemical species that are suitable for reacting with certain materials on the surface of the substrate. Furthermore, during the etching of a substrate, plasma may be utilized to create charged species that are useful for delivering energy to surface reactions on the substrate.

According to one example, pattern etching comprises the application of a lithographic layer, such as a thin layer of radiation-sensitive material (e.g., photo-resist), to an upper surface of a substrate that is subsequently patterned in order to provide a mask for transferring this pattern to the underlying thin film on the substrate during etching. The patterning of the radiation-sensitive material generally involves exposure of the lithographic layer to a geometric pattern of electromagnetic (EM) radiation using, for example, a micro-lithography system, followed by the removal of the irradiated regions of the radiation-sensitive material (as in the case of positive tone photo-resist), or non-irradiated regions (as in the case of negative tone photo-resist) using a developing solution.

In order to pattern thinner features in the lithographic layer using conventional lithography techniques, multi-layer masks can be implemented. For example, the multi-layer mask may include a bilayer mask or trilayer mask. With the inclusion of a second or third mask layer, the uppermost lithographic layer may be thinner than the thickness customarily chosen to withstand the subsequent dry etching process (es) and, therefore, using conventional lithography techniques, finer features may be formed in the thinner lithographic layer. Thereafter, the finer feature formed in the lithographic layer may be transferred to the underlying second or third mask layers using a dry development process, such as a dry etching process.

However, during the pattern transfer to the underlying second and third mask layers of the multi-layer mask, there exists a need to produce additional control of the pattern integrity and CD including, but not limited to, CD reduction, CD enlargement, pattern roughness reduction, etc. Additionally, there exists a need to uniformly or differentially maintain, enlarge, or reduce the CD across the substrate. Furthermore, there exists a need to uniformly or differentially apply CD control to nested (closely spaced) structures and isolated (widely spaced structures) structures. Further yet, there exists a need to correct for pattern deficiencies in the multi-layer mask, such as line edge roughness (LER) and line width roughness (LWR). During pattern transfer, conventional process chemistries fail to produce acceptable CD control.

According to one embodiment, CD control is applied to patterning a gate stack in front-end-of-line (FEOL) operations. Therein, it may be desirable to reduce the line CD in the multi-layer mask by etching (or trimming) the printed multi-layer mask to form a narrower gate. As shown in FIG. 1A, a gate stack 100 formed on a substrate 110 is illustrated, the gate stack 100 including a gate interfacial layer 120, a gate dielectric 130, a gate electrode 140, and a multi-layer mask 150. At least a portion of the multi-layer mask 150 may be printed with an initial pattern CD 152 for the gate. By removing material from the exposed sidewalls of the multi-layer mask 150, an intermediate pattern CD 154 may be produced, thus, reducing the line CD for the gate. Thereafter, the intermediate pattern CD 154 may be extended into the underlying layers (see the dotted lines in FIG. 1A) to produce a patterned gate stack having reduced line-width.

Figure 1B:
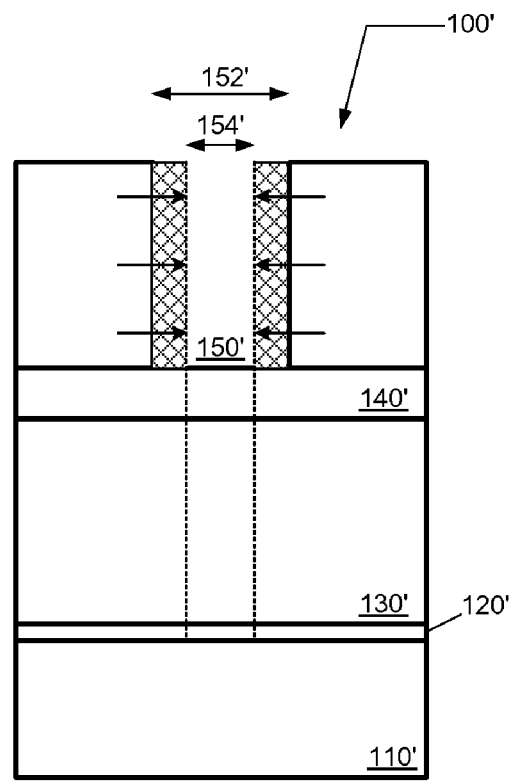

According to another embodiment, CD control is applied to patterning a trench or via for metallization in back-end-of-line (BEOL) operations. Therein, it may be desirable to reduce the space CD (or enlarge the line CD) in the multi-layer mask by depositing on the printed multi-layer mask to form a narrower trench or via. As shown in FIG. 1B, an interconnect stack 100' formed on a substrate 110' is illustrated, the interconnect stack 100' including a first cap layer 120', an interconnect dielectric 130', a second cap layer 140', and a multi-layer mask 150'. At least a portion of the multi-layer mask 150' may be printed with an initial pattern CD 152' for the trench or via. By adding material to the exposed sidewalls of the multi-layer mask 150', an intermediate pattern CD 154' may be produced, thus, reducing the space CD for the trench or via. Thereafter, the intermediate pattern CD 154' may be extended into the underlying layers (see the dotted lines in FIG. 1B) to produce a patterned interconnect stack having reduced space-width.

Figure 2A:
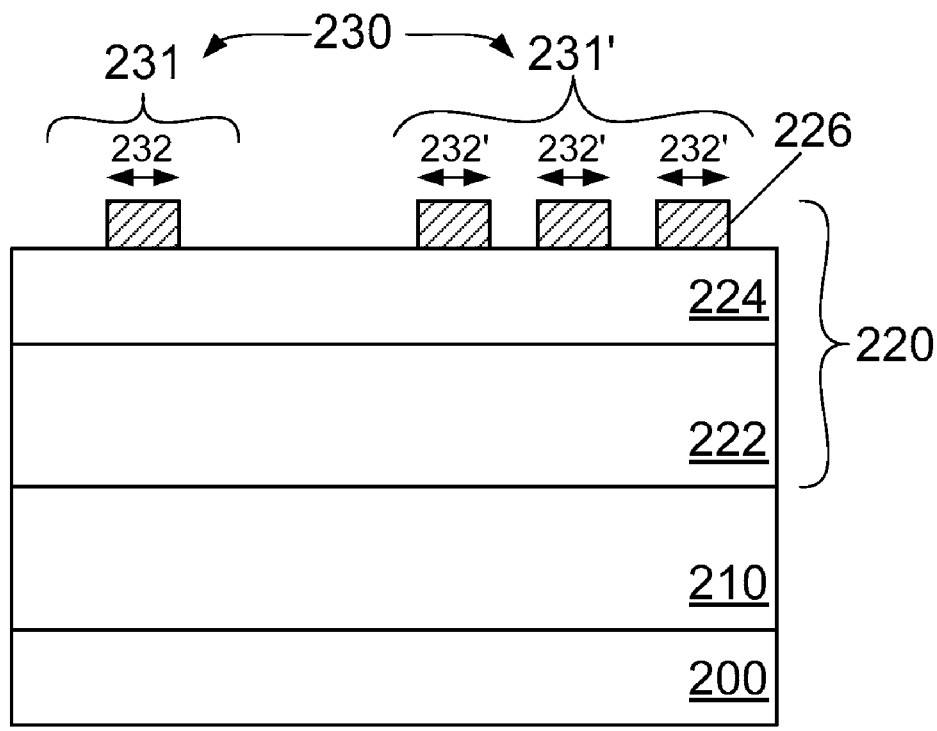
FIGS. 2A through 2C illustrate a schematic representation of a procedure for patterning a multi-layer mask on a substrate.
Figure 2B:
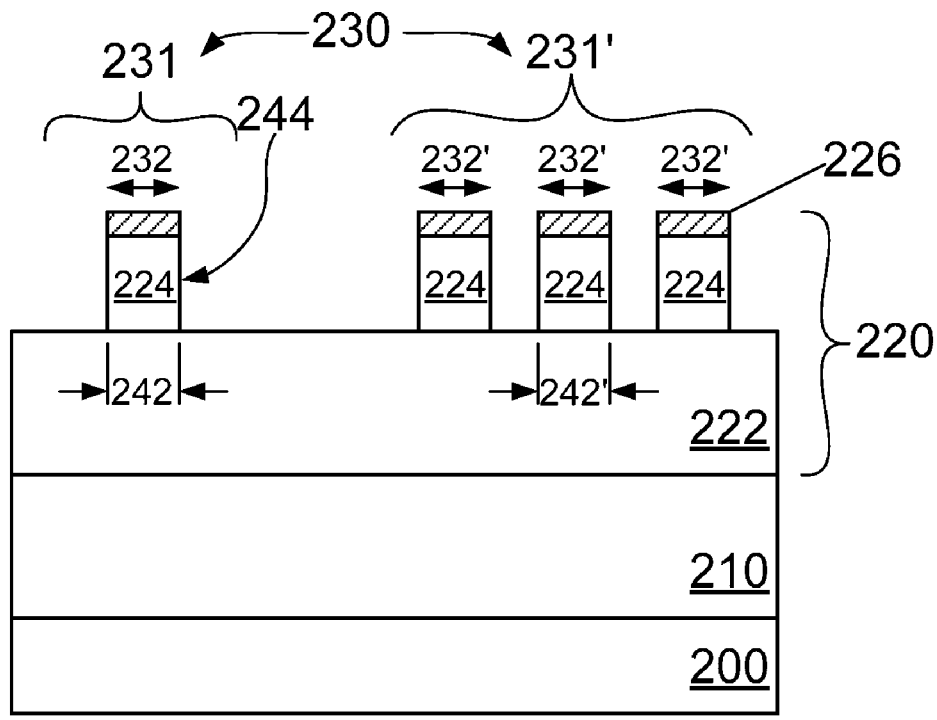
Figure 2C:
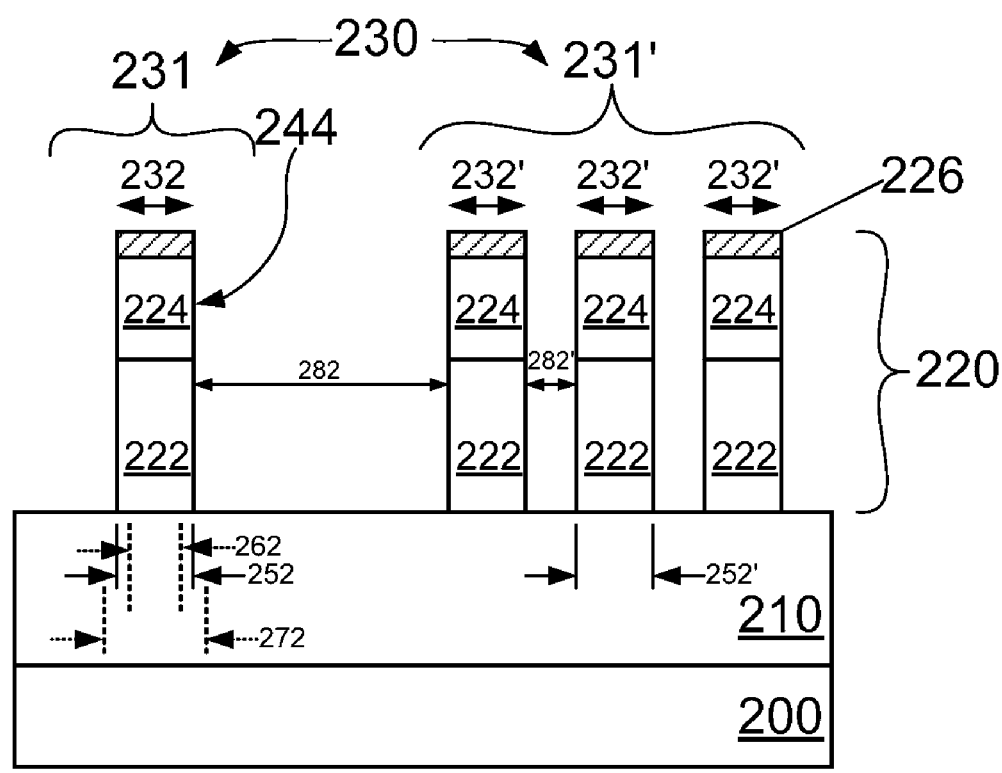
Figure 3:
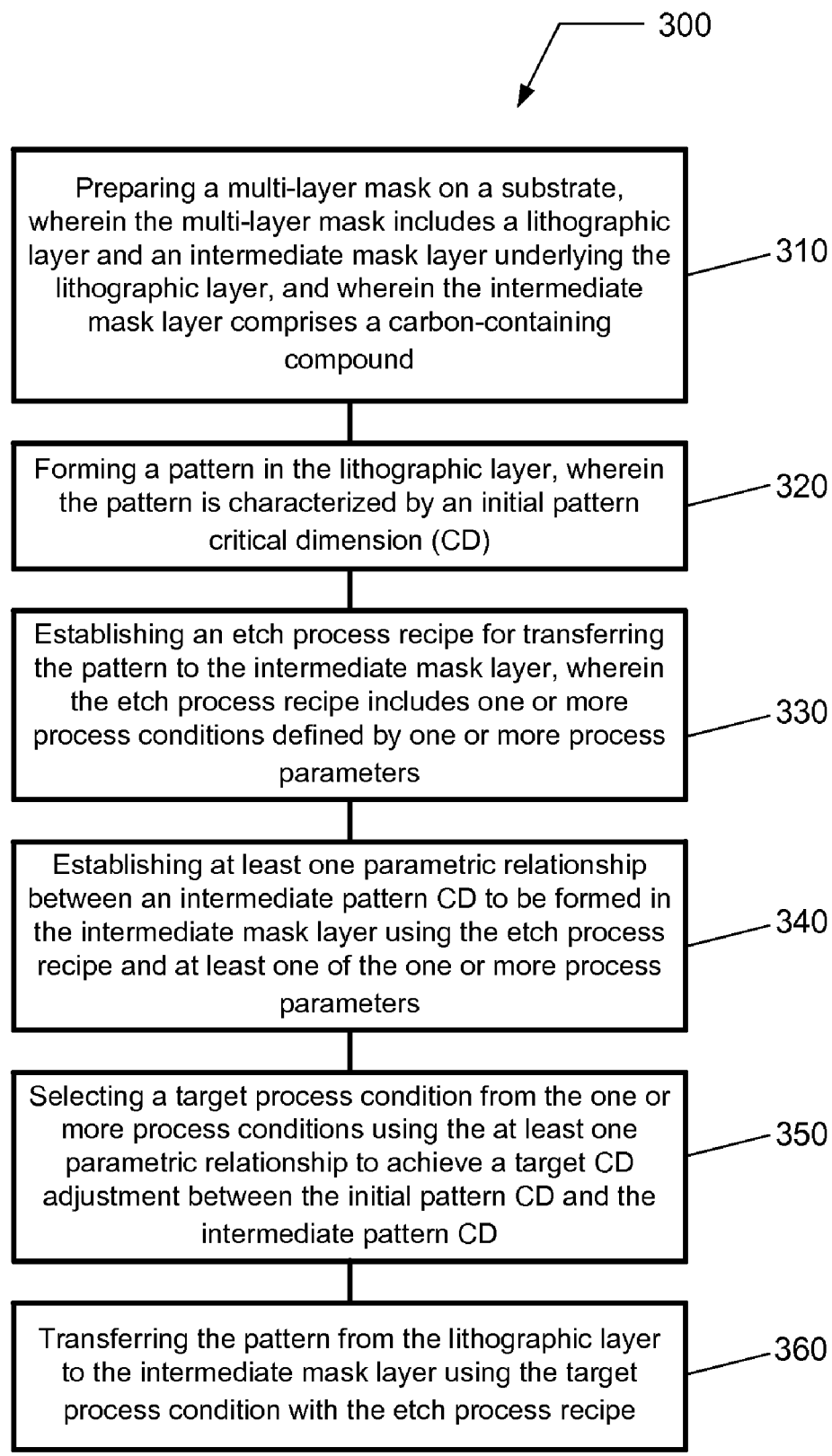
FIG. 3 provides a flow chart illustrating a method of patterning a multi-layer mask on a substrate according to an embodiment.

Therefore, according to an embodiment, a method of patterning a multi-layer mask on a substrate is schematically illustrated in FIGS. 2A through 2C, and is illustrated in a flow chart 300 in FIG. 3. Unlike conventional multi-layer mask patterning methods, the method described herein is capable of both CD reduction and CD enlargement. The method begins in 310 with forming a multi-layer mask 220 on a thin film 210, to which a pattern is to be transferred, upon substrate 200. The multi-layer mask 220 comprises a lithographic layer 226, an optional anti-reflective coating (ARC) layer 224, and an intermediate mask layer 222.

The substrate 200 may comprise a semiconductor substrate, a silicon-on-insulator (SOI) substrate, a flat panel display, or a liquid crystal display.

The thin film 210 may comprise a conductive layer, a non-conductive layer, or a semi-conductive layer. For instance, the thin film 210 may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, or silicon oxynitride, etc. Additionally, for instance, the thin film 210 may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film 210 may have a dielectric constant of less than 3.7, or a dielectric constant ranging from 1.6 to 3.7. The thin film 210 may be porous or non-porous.

According to one embodiment, the thin film 210 comprises silicon nitride (SiN, or more generally $Si_xN_y$). For example, the thin film of silicon nitride may be used as a hard mask layer when preparing a gate pattern in a poly-silicon or metal gate. The pattern is etched, as will be discussed below, into the silicon nitride and, ultimately, the underlying layers.

The thin film 210 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The lithographic layer 226 may comprise a layer of radiation-sensitive material, such as photo-resist. The photo-resist layer may comprise 248 nm (nanometer) resists, 193 nm resists, 157 nm resists, EUV (extreme ultraviolet) resists, or electron beam sensitive resist. The photo-resist layer can be formed using a track system. For example, the track system can comprise a Clean Track ACT 8, ACT 12, or Lithius resist coating and developing system commercially available from Tokyo Electron Limited (TEL). Other systems and methods for forming a photo-resist layer on a substrate are well known to those skilled in the art of spin-on resist technology.

The optional ARC layer 224 may comprise a silicon-containing ARC layer. For example, the optional ARC layer 224 may comprise a silicon-containing ARC commercially available as Sepr-Shb Aseries SiARC from Shin Etsu Chemical Co., Ltd. The optional ARC layer 224 may, for example, be applied using spin coating technology, or a vapor deposition process.

The intermediate mask layer 222 may comprise an inorganic layer or an organic layer. For example, the intermediate mask layer 222 may comprise a carbon-containing compound. Additionally, for example, the intermediate mask layer 222 may comprise amorphous carbon. Furthermore, for example, the intermediate mask layer 222 may comprise an organic dielectric layer (ODL) or organic planarization layer (OPL). The ODL or OPL may include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed using spin-on techniques or vapor deposition techniques.

In 320, a pattern 230 is formed in the lithographic layer 226, wherein the pattern 230 is characterized by an initial pattern CD 232, 232'. As shown in FIG. 2A, the lithographic layer 226 is imaged with an image pattern. The exposure to EM radiation is performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Thereafter, the image pattern is developed in the lithographic layer 226 to form the pattern 230 having isolated structures 231 with initial pattern CD 232 and nested structures 231' with initial pattern CD 232'. The developing process can include exposing the substrate to a developing solution in a developing system, such as a track system. For example, the track system can comprise a Clean Track ACT 8, ACT 12, or Lithius resist coating and developing system commercially available from Tokyo Electron Limited (TEL).

Following patterning of the lithographic layer 226, substrate 200 may be transferred to and disposed within a plasma processing system, to be discussed in greater detail below.

As shown in FIG. 2B, the pattern 230 including isolated structures 231 and nested structures 231' is transferred from the lithographic layer 226 to the optional ARC layer 224, such as a silicon-containing ARC layer, using a dry plasma etching process. The etching process may comprise establishing a process recipe, introducing a process composition including a process gas having a halogen-containing compound, such as a fluorocarbon compound, a fluorohydrocarbon compound, and/or $SF_6$, and an optional additive gas having an oxygen-containing gas, a hydrogen-containing gas, a nitrogen-containing gas, a carbon-containing gas, and/or a hydrocarbon gas to the plasma processing system according to the process recipe, forming plasma from the process composition in the plasma processing system according to the process recipe, and exposing the substrate 200 to the plasma in order to transfer the pattern 230 in the lithographic layer 226 to the underlying optional ARC layer 224.

The hydrocarbon gas may comprise a $C_xH_y$-containing gas, wherein x and y are integers greater than or equal to one. For example, the hydrocarbon gas may comprise a halogen-free, $C_xH_y$-containing gas. Additionally, for example, the hydrocarbon gas may comprise $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, and $C_6H_{12}$. For example, the process composition may comprise $SF_6$ and $C_2H_4$. Alternatively, for example, the process composition may consist of $SF_6$ and $C_2H_4$.

The process composition may further comprise $CF_4$, $C_3F_6$, $C_4F_6$, $C_4F_8$, $C_5F_8$, $CHF_3$, or $CH_2F_2$, or a combination of two or more thereof. Additionally, the process composition may further comprise an inert gas, i.e., a gas that is chemically inert at the substrate surface in the presence of plasma. For example, the process gas may comprise a noble gas. Alternatively yet, the process gas may comprise argon (Ar).

As shown in FIG. 2B, during the pattern transfer, the initial pattern CD 232 for the isolated structures 231 of pattern 230 in the lithographic layer 226 is maintained as, reduced to, or enlarged to an ARC pattern 244 having ARC pattern CD 242 in the optional ARC layer 224. Additionally, during the pattern transfer, the initial pattern CD 232' for the nested structures 231' of pattern 230 in the lithographic layer 226 is maintained as, reduced to, or enlarged to an ARC pattern CD 242' in the optional ARC layer 224.

As shown in FIG. 2C, the pattern 230 including isolated structures 231 and nested structures 231' is transferred from the lithographic layer 226 or the optional ARC layer 224 to the intermediate mask layer 222 using a dry plasma etching process. The isolated structures 231 are spaced apart from the nested structures 231' by a first distance 282, and the nested structures 231' are spaced apart from one another by a second distance 282'. Therein, during the pattern transfer, the initial pattern CD 232 for the isolated structures 231 of pattern 230 in the lithographic layer 226 is maintained as, reduced to, or enlarged to an intermediate pattern CD 252, 262, 272, respectively, in the intermediate mask layer 222. Additionally, during the pattern transfer, the initial pattern CD 232' for the nested structures 231' of pattern 230 in the lithographic layer 226 is maintained as, reduced to, or enlarged to an intermediate pattern CD 252', 262', 272', respectively, in the intermediate mask layer 222.

In 330, an etch process recipe is established for transferring the pattern 230 to the intermediate mask layer 222, wherein the etch process recipe includes one or more process conditions defined by one or more process parameters. The etch process recipe includes plasma formation using a process composition containing a bromine-containing gas, an oxygen-containing gas, and an optional noble gas.

The bromine-containing gas may contain HBr, $Br_2$, or $C_2H_4Br_2$, or any combination of two or more thereof. For example, the bromine-containing gas may contain HBr. Additionally, for example, the bromine-containing gas may consist of HBr. The oxygen-containing gas may contain $O_2$, CO, $CO_2$, NO, or $NO_2$, or any combination of two or more thereof. For example, the oxygen-containing gas may contain $O_2$. Additionally, for example, the oxygen-containing gas may contain $O_2$ and $CO_2$. In one embodiment, the process composition consists of HBr, one or more oxygen-containing gases selected from the group consisting of $O_2$ and $CO_2$, and an optional noble gas. In an alternate embodiment, the process composition consists of HBr, $O_2$, $CO_2$, and He.

The one or more process conditions may be established by setting one or more process parameters, such as: setting a flow rate of the bromine-containing gas; setting a flow rate of the oxygen-containing gas; setting a flow ratio between an amount of the oxygen-containing gas and an amount of the bromine-containing gas; setting a flow ratio between a flow rate of the oxygen-containing gas and a flow rate of the bromine-containing gas; setting a pressure in the plasma processing system; setting a first power level for a first radio frequency (RF) signal applied to a lower electrode within a substrate holder for supporting the substrate; setting a second power level for a second RF signal applied to an upper electrode opposing the lower electrode above the substrate; setting a temperature condition for the plasma processing system; setting a temperature condition for the substrate or substrate holder; setting an etch time; and/or setting an over-etch time.

In 340, at least one parametric relationship is established between the intermediate pattern CD 252, 262, 272, 252', 262', 272' to be formed in the intermediate mask layer 222 using the etch process recipe and at least one of the one or more process parameters, wherein the at least one parametric relationship provides a first process condition for increasing the initial pattern CD 232, 232' to the intermediate pattern CD 272, 272' and a second process condition for decreasing the initial pattern CD 232, 232' to the intermediate pattern CD 262, 262'.

The at least one parametric relationship may include use of any one or more of the process parameters identified above. For example, the at least one parametric relationship may establish a relationship between the intermediate pattern CD 252, 262, 272, 252', 262', 272' and a flow ratio between an amount of the oxygen-containing gas and an amount of the bromine-containing gas. The flow ratio may be evaluated as a flow rate of $O_2$ divided by a flow rate of HBr. As will be discussed in greater detail in FIG. 11A, the initial pattern CD 232, 232' may be decreased to the intermediate pattern CD 262, 262' by decreasing a flow rate of the bromine-containing gas relative to a flow rate of the oxygen-containing gas, i.e., creating an etch condition. Alternatively, the initial pattern CD 232, 232' may be increased to the intermediate pattern CD 272, 272' by increasing a flow rate of the bromine-containing gas relative to a flow rate of the oxygen-containing gas, i.e., creating a deposition condition. The inventors surmise that during an etch condition, the production of volatile by-products, such as $CO_2$ and $H_2O$, is favored, while during a deposition condition, the production of non-volatile by-products, such as $SiBr_xO_y$, is favored.

Additionally, for example, the at least one parametric relationship may establish a relationship between the intermediate pattern CD 252, 262, 272, 252', 262', 272' and an over-etch time. As will be discussed in greater detail in FIG. 11B, the initial pattern CD 232, 232' may be decreased to the intermediate pattern CD 262, 262', or further decreased from the intermediate pattern CD 262, 262' to a third CD, by increasing the over-etch time. The over-etch time may be a fraction of the etch time.

In 350, a target process condition from the one or more process conditions using the at least one parametric relationship is selected to achieve a target CD adjustment between the initial pattern CD 232, 232' and the intermediate pattern CD 252, 252', 262, 262', 272, 272'.

In 360, the pattern 230 from the lithographic layer 226 is transferred to the intermediate mask layer 222 using the target process condition with the etch process recipe.

The method may further include establishing at least one second parametric relationship between a pattern roughness for the pattern 230 in the intermediate mask layer 222 and at least one of the one or more process parameters, wherein the at least one second parametric relationship provides a process condition for reducing the pattern roughness. The pattern roughness may include line edge roughness (LER), or line width roughness (LWR), or a combination thereof.

Figure 4:
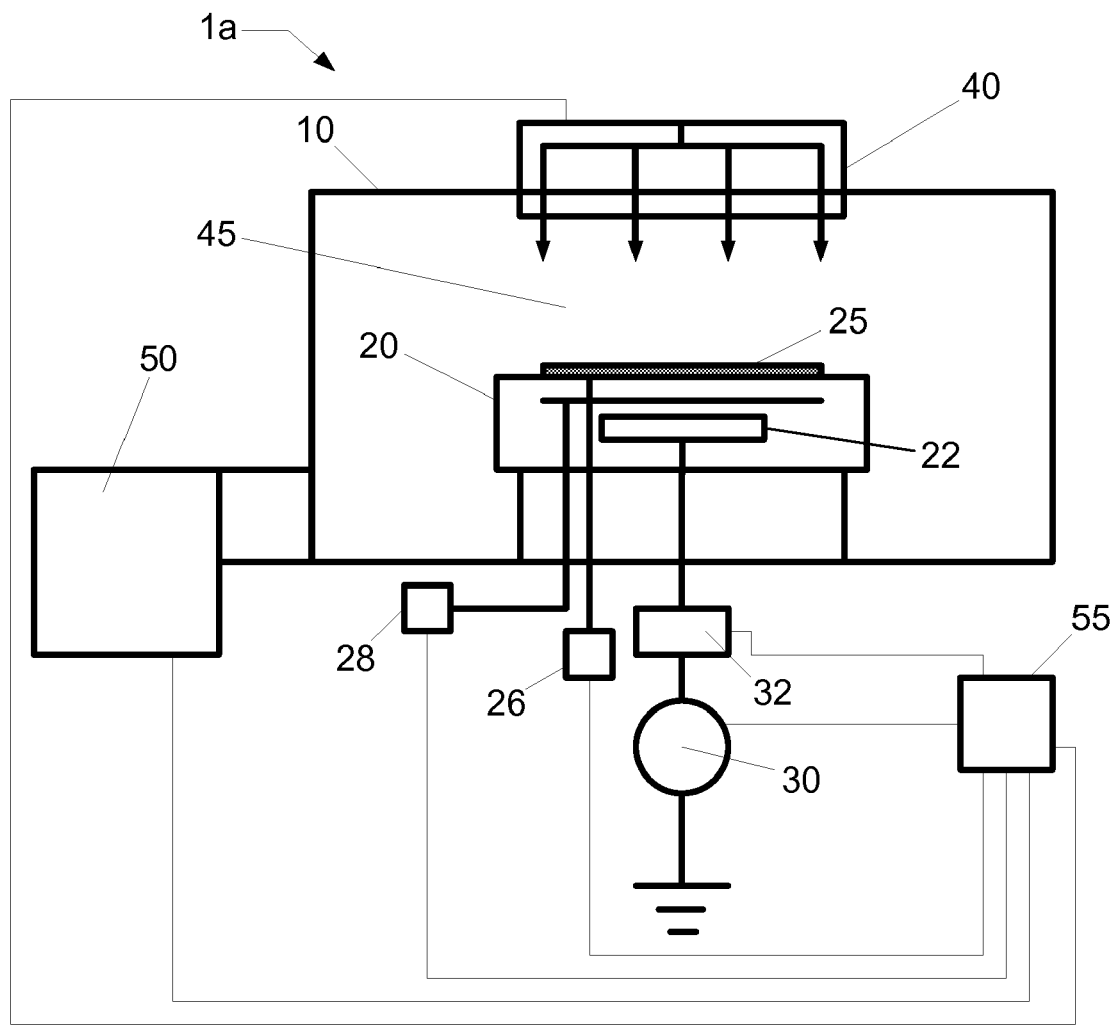
FIG. 4 shows a schematic representation of a plasma processing system according to an embodiment.

According to one embodiment, a plasma processing system 1a configured to perform the above identified process conditions is depicted in FIG. 4 comprising a plasma processing chamber 10, substrate holder 20, upon which a substrate 25 to be processed is affixed, and vacuum pumping system 50. Substrate 25 can be a semiconductor substrate, a wafer, a flat panel display, or a liquid crystal display. Plasma processing chamber 10 can be configured to facilitate the generation of plasma in processing region 45 in the vicinity of a surface of substrate 25. An ionizable gas or mixture of process gases is introduced via a gas distribution system 40. For a given flow of process gas, the process pressure is adjusted using the vacuum pumping system 50. Plasma can be utilized to create materials specific to a pre-determined materials process, and/or to aid the removal of material from the exposed surfaces of substrate 25. The plasma processing system 1a can be configured to process substrates of any desired size, such as 200 mm substrates, 300 mm substrates, or larger.

Substrate 25 can be affixed to the substrate holder 20 via a clamping system 28, such as a mechanical clamping system or an electrical clamping system (e.g., an electrostatic clamping system). Furthermore, substrate holder 20 can include a heating system (not shown) or a cooling system (not shown) that is configured to adjust and/or control the temperature of substrate holder 20 and substrate 25. The heating system or cooling system may comprise a re-circulating flow of heat transfer fluid that receives heat from substrate holder 20 and transfers heat to a heat exchanger system (not shown) when cooling, or transfers heat from the heat exchanger system to substrate holder 20 when heating. In other embodiments, heating/cooling elements, such as resistive heating elements, or thermo-electric heaters/coolers can be included in the substrate holder 20, as well as the chamber wall of the plasma processing chamber 10 and any other component within the plasma processing system 1a.

Additionally, a heat transfer gas can be delivered to the backside of substrate 25 via a backside gas supply system 26 in order to improve the gas-gap thermal conductance between substrate 25 and substrate holder 20. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 25.

In the embodiment shown in FIG. 4, substrate holder 20 can comprise an electrode 22 through which RF power is coupled to the processing plasma in processing region 45. For example, substrate holder 20 can be electrically biased at a RF voltage via the transmission of RF power from a RF generator 30 through an optional impedance match network 32 to substrate holder 20. The RF bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Alternately, RF power is applied to the substrate holder electrode at multiple frequencies. Furthermore, impedance match network 32 can improve the transfer of RF power to plasma in plasma processing chamber 10 by reducing the reflected power. Match network topologies (e.g. L-type, π-type, T-type, etc.) and automatic control methods are well known to those skilled in the art.

Gas distribution system 40 may comprise a showerhead design for introducing a mixture of process gases. Alternatively, gas distribution system 40 may comprise a multi-zone showerhead design for introducing a mixture of process gases and adjusting the distribution of the mixture of process gases above substrate 25. For example, the multi-zone showerhead design may be configured to adjust the process gas flow or composition to a substantially peripheral region above substrate 25 relative to the amount of process gas flow or composition to a substantially central region above substrate 25.

Vacuum pumping system 50 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 10.

Controller 55 comprises a microprocessor, memory, and a digital I/O port capable of generating control voltages sufficient to communicate and activate inputs to plasma processing system 1a as well as monitor outputs from plasma processing system 1a. Moreover, controller 55 can be coupled to and can exchange information with RF generator 30, impedance match network 32, the gas distribution system 40, vacuum pumping system 50, as well as the substrate heating/cooling system (not shown), the backside gas delivery system 26, and/or the electrostatic clamping system 28. For example, a program stored in the memory can be utilized to activate the inputs to the aforementioned components of plasma processing system 1a according to a process recipe in order to perform a plasma assisted process on substrate 25.

Controller 55 can be locally located relative to the plasma processing system 1a, or it can be remotely located relative to the plasma processing system 1a. For example, controller 55 can exchange data with plasma processing system 1a using a direct connection, an intranet, and/or the internet. Controller 55 can be coupled to an intranet at, for example, a customer site (i.e., a device maker, etc.), or it can be coupled to an intranet at, for example, a vendor site (i.e., an equipment manufacturer). Alternatively or additionally, controller 55 can be coupled to the internet. Furthermore, another computer (i.e., controller, server, etc.) can access controller 55 to exchange data via a direct connection, an intranet, and/or the internet.

In the embodiment shown in FIG. 5, plasma processing system 1b can be similar to the embodiment of FIG. 4 and further comprise either a stationary, or mechanically or electrically rotating magnetic field system 60, in order to potentially increase plasma density and/or improve plasma processing uniformity, in addition to those components described with reference to FIG. 4. Moreover, controller 55 can be coupled to magnetic field system 60 in order to regulate the speed of rotation and field strength. The design and implementation of a rotating magnetic field is well known to those skilled in the art.

Figure 5:
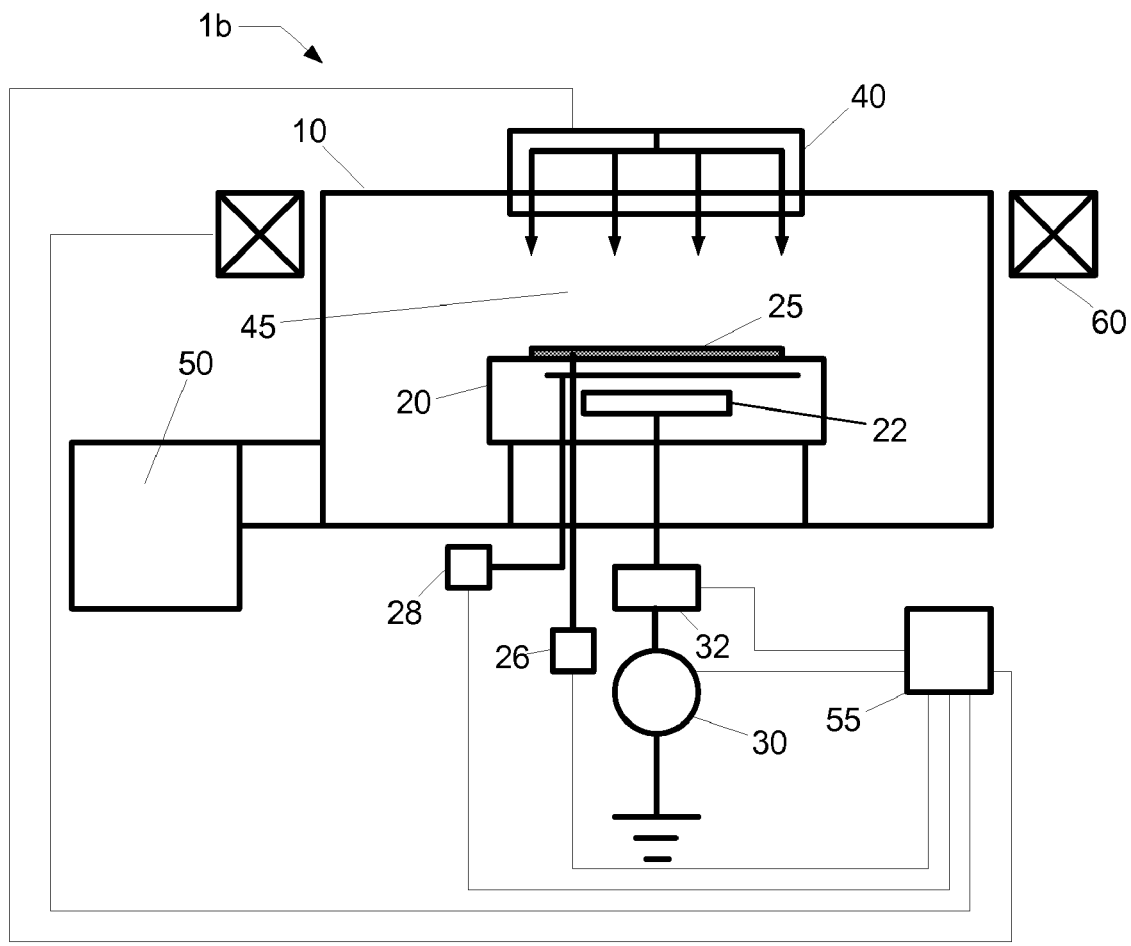
FIG. 5 shows a schematic representation of a plasma processing system according to another embodiment.
Figure 6:
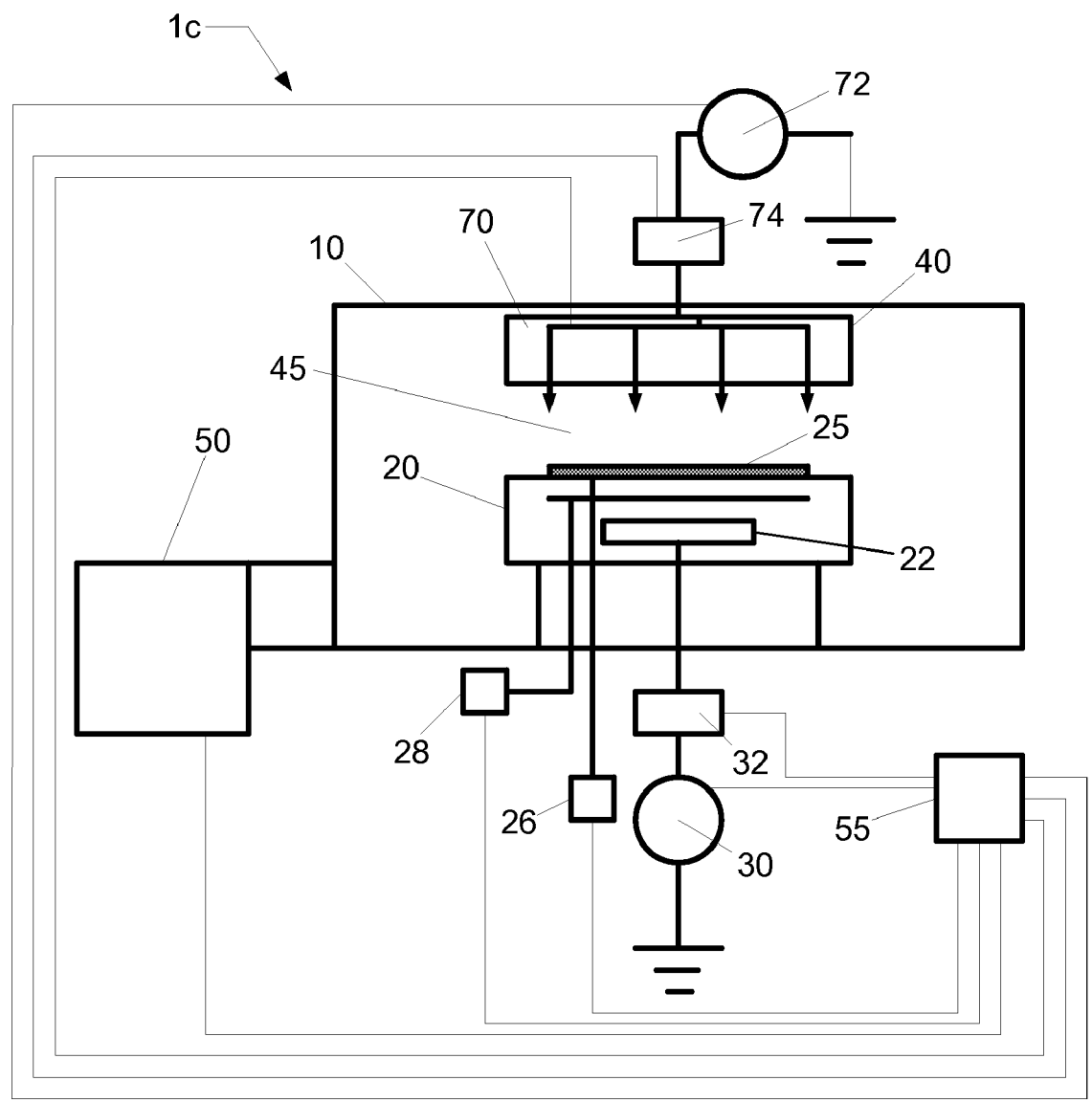
FIG. 6 shows a schematic representation of a plasma processing system according to another embodiment.

In the embodiment shown in FIG. 6, plasma processing system 1c can be similar to the embodiment of FIG. 4 or FIG. 5, and can further comprise an upper electrode 70 to which RF power can be coupled from RF generator 72 through optional impedance match network 74. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 55 is coupled to RF generator 72 and impedance match network 74 in order to control the application of RF power to upper electrode 70. The design and implementation of an upper electrode is well known to those skilled in the art. The upper electrode 70 and the gas distribution system 40 can be designed within the same chamber assembly, as shown.

Figure 7:
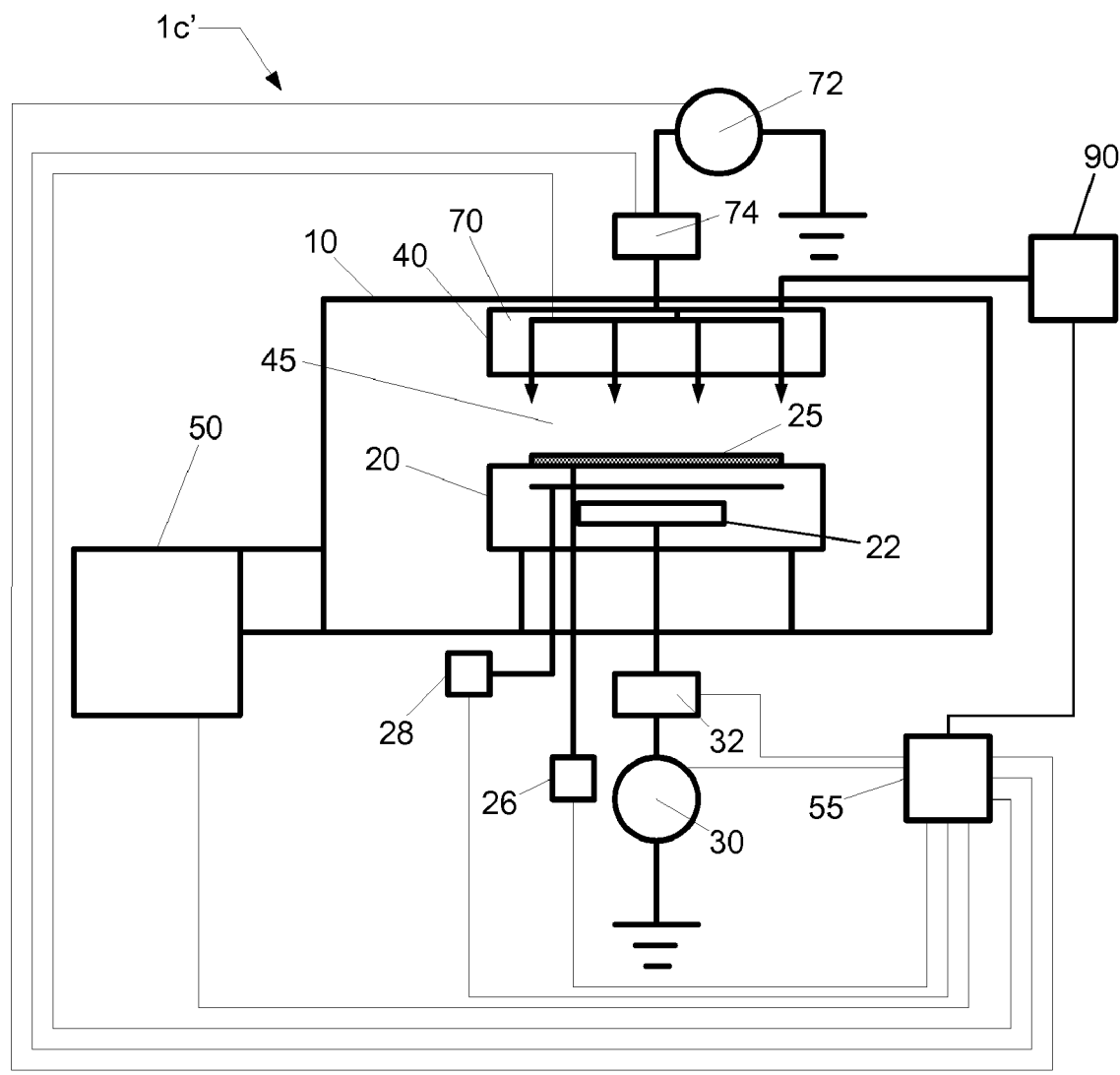
FIG. 7 shows a schematic representation of a plasma processing system according to another embodiment.

In the embodiment shown in FIG. 7, plasma processing system 1c' can be similar to the embodiment of FIG. 6, and can further comprise a direct current (DC) power supply 90 coupled to the upper electrode 70 opposing substrate 25. The upper electrode 70 may comprise an electrode plate. The electrode plate may comprise a silicon-containing electrode plate. Moreover, the electrode plate may comprise a doped silicon electrode plate. The DC power supply 90 can include a variable DC power supply. Additionally, the DC power supply can include a bipolar DC power supply. The DC power supply 90 can further include a system configured to perform at least one of monitoring, adjusting, or controlling the polarity, current, voltage, or on/off state of the DC power supply 90. Once plasma is formed, the DC power supply 90 facilitates the formation of a ballistic electron beam. An electrical filter (not shown) may be utilized to de-couple RF power from the DC power supply 90.

For example, the DC voltage applied to upper electrode 70 by DC power supply 90 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 70. The surface of the upper electrode 70 facing the substrate holder 20 may be comprised of a silicon-containing material.

Figure 8:
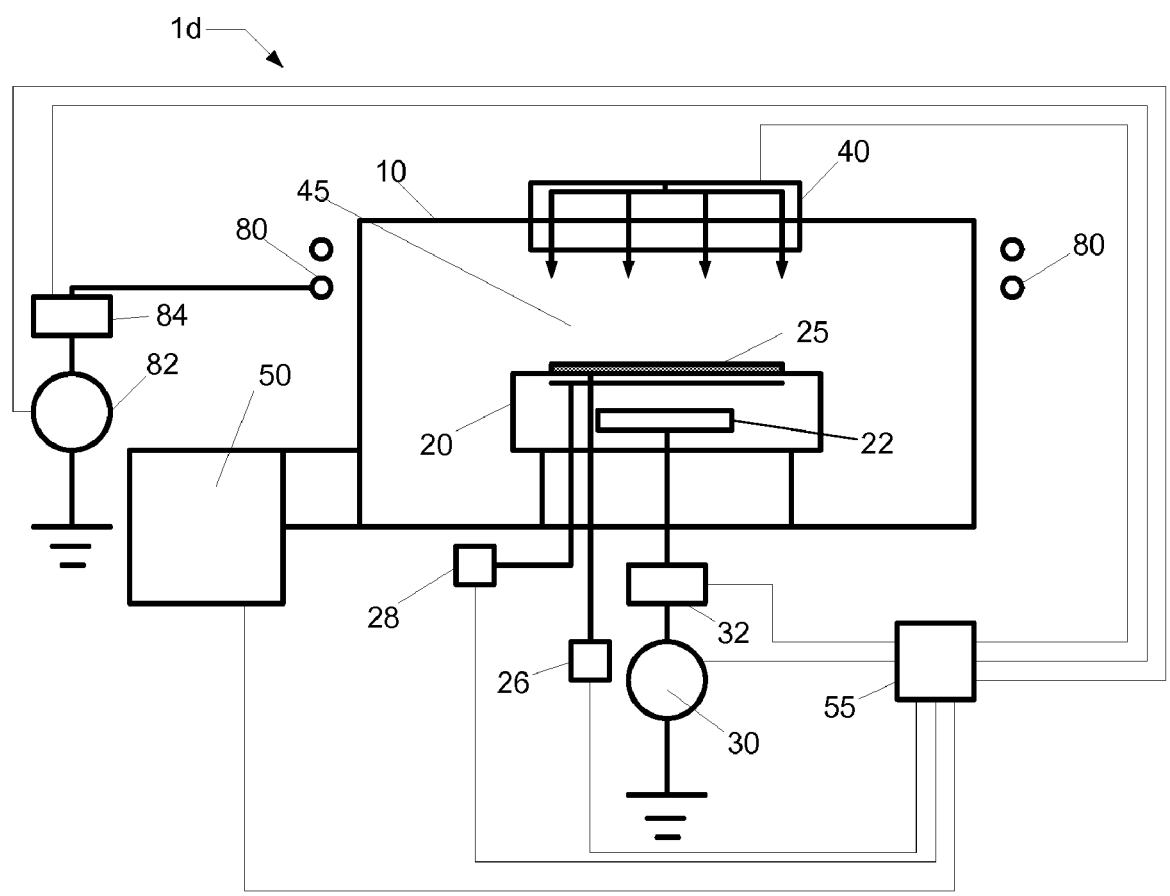
FIG. 8 shows a schematic representation of a plasma processing system according to another embodiment.

In the embodiment shown in FIG. 8, plasma processing system 1d can be similar to the embodiments of FIGS. 4 and 5, and can further comprise an inductive coil 80 to which RF power is coupled via RF generator 82 through optional impedance match network 84. RF power is inductively coupled from inductive coil 80 through a dielectric window (not shown) to plasma processing region 45. A frequency for the application of RF power to the inductive coil 80 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 80 and plasma in the processing region 45. Moreover, controller 55 can be coupled to RF generator 82 and impedance match network 84 in order to control the application of power to inductive coil 80.

Figure 9:
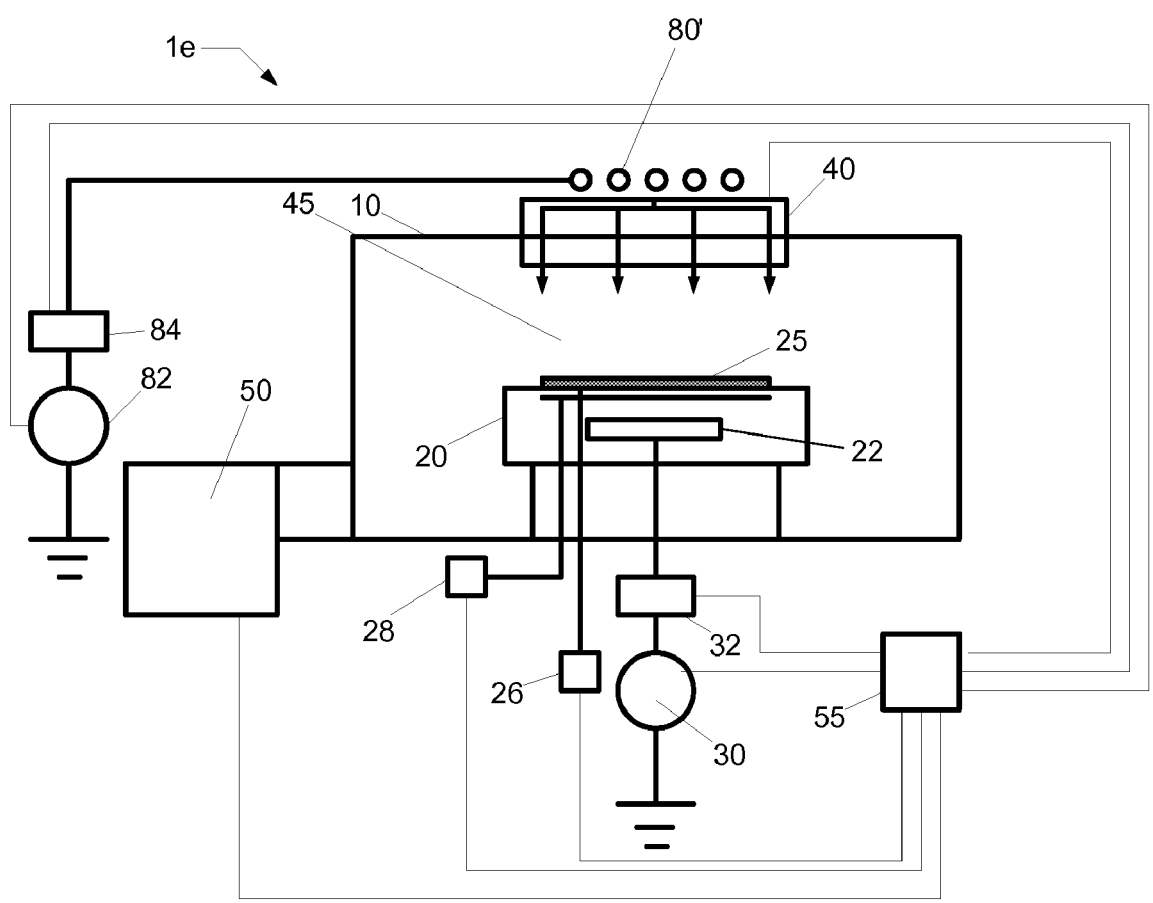
FIG. 9 shows a schematic representation of a plasma processing system according to another embodiment.

In an alternate embodiment, as shown in FIG. 9, plasma processing system 1e can be similar to the embodiment of FIG. 8, and can further comprise an inductive coil 80' that is a "spiral" coil or "pancake" coil in communication with the plasma processing region 45 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 10:
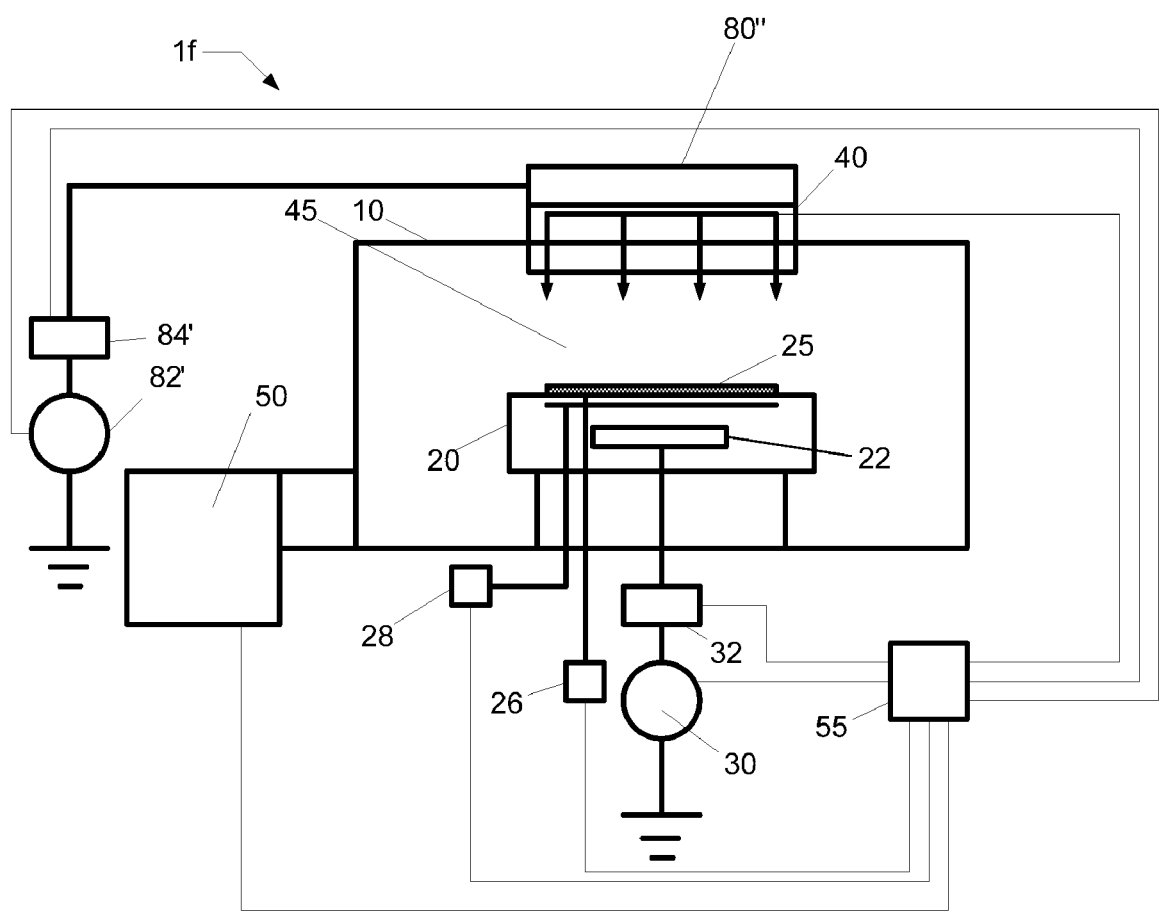
FIG. 10 shows a schematic representation of a plasma processing system according to another embodiment.

In the embodiment shown in FIG. 10, plasma processing system 1f can be similar to the embodiment of FIG. 4, and can further comprise a surface wave plasma (SWP) source 80". The SWP source 80" can comprise a slot antenna, such as a radial line slot antenna (RLSA), to which microwave power is coupled via microwave generator 82' through optional impedance match network 84'.

In one embodiment, the process recipe for pattern etching an intermediate mask layer in a multi-layer mask may comprise at least one process condition that includes: a chamber pressure ranging up to about 1000 mtorr (millitorr) (e.g., up to about 100 mtorr, or up to about 5 to 30 mtorr, or about 10 mtorr), a bromine-containing gas process gas flow rate ranging up to about 2000 sccm (standard cubic centimeters per minute) (e.g., up to about 1000 sccm, or about 1 sccm to about 100 sccm), an oxygen-containing gas process gas flow rate ranging up to about 2000 sccm (standard cubic centimeters per minute) (e.g., up to about 1000 sccm, or about 1 sccm to about 100 sccm), an optional noble gas process gas flow rate ranging up to about 2000 sccm (e.g., up to about 1000 sccm, an upper electrode (e.g., element 70 in FIG. 6) RF bias ranging up to about 2000 W (watts) (e.g., up to about 1000 W, or up to about 700 W), and a lower electrode (e.g., element 22 in FIG. 6) RF bias ranging up to about 1000 W (e.g., up to about 600 W, or up to about 300 W). Also, the upper electrode bias frequency can range from about 0.1 MHz to about 200 MHz, e.g., about 60 MHz. In addition, the lower electrode bias frequency can range from about 0.1 MHz to about 100 MHz, e.g., about 2 MHz.

Figure 11A:
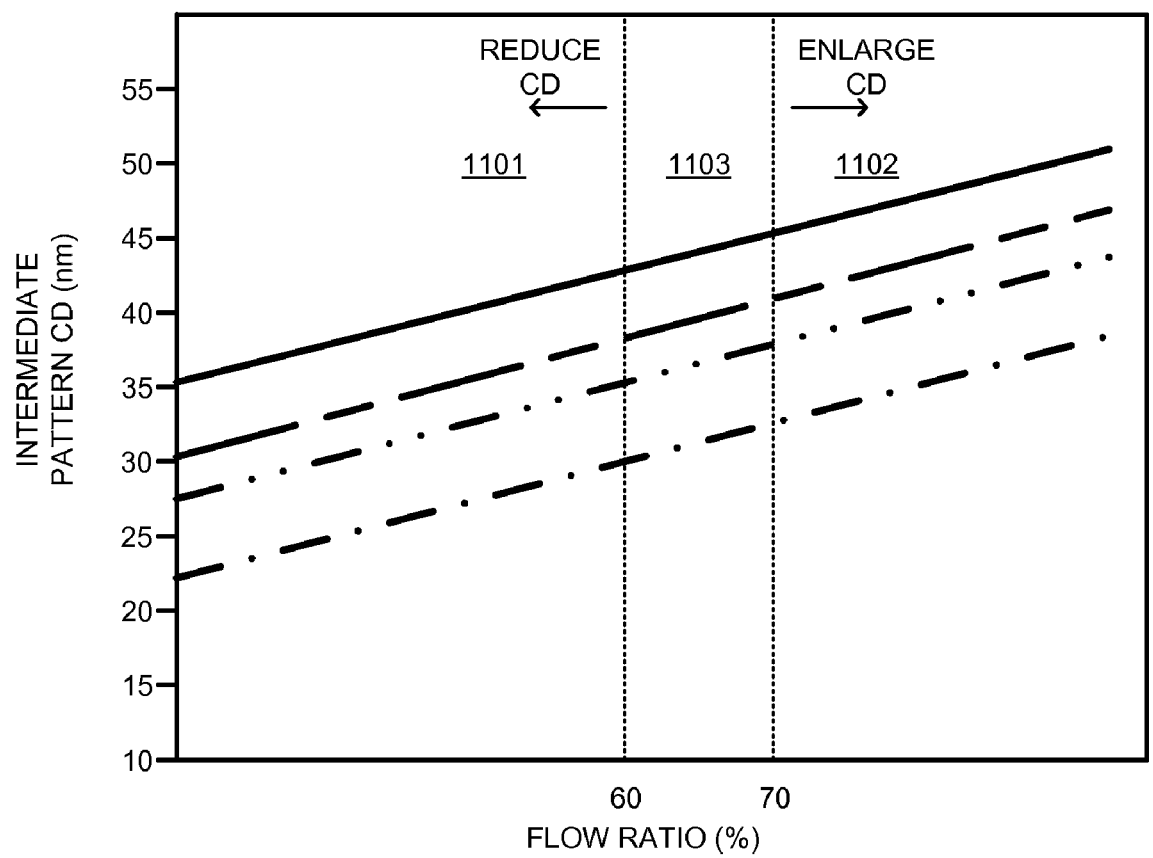
FIGS. 11A and 11B provide exemplary data for a method of patterning a multi-layer mask on a substrate according to various embodiments.

In one example, as illustrated in FIG. 11A, an OPL is patterned using a process composition containing $HBr/O_2/CO_2/He$. A parametric relationship is established between the intermediate pattern CD (nm, nanometers) and a flow ratio between $O_2$ and HBr, while holding the flow rate of $CO_2/He$ constant. The initial pattern CD and the intermediate pattern CD correspond to a space CD. The parametric relationship includes a family of data curves, each data curve being prepared for a different initial pattern CD, i.e., 44 nm (solid line), 40 nm (long dash-short dash line), 37 nm (dash-double dot line), and 32 nm (dash-dot line). The parametric relationship includes at least one process condition 1101, wherein the initial pattern CD is reduced to the intermediate pattern CD, and at least another process condition 1102, wherein the initial pattern CD is enlarged to the intermediate pattern CD. Further, the parametric relationship includes at least yet another process condition 1103, wherein the initial pattern CD is maintained substantially the same as the intermediate pattern CD. While increasing the amount of the oxygen-containing gas relative to the amount of the bromine-containing gas, the process condition varies from CD reduction to CD enlargement of the space CD.

Figure 11B:
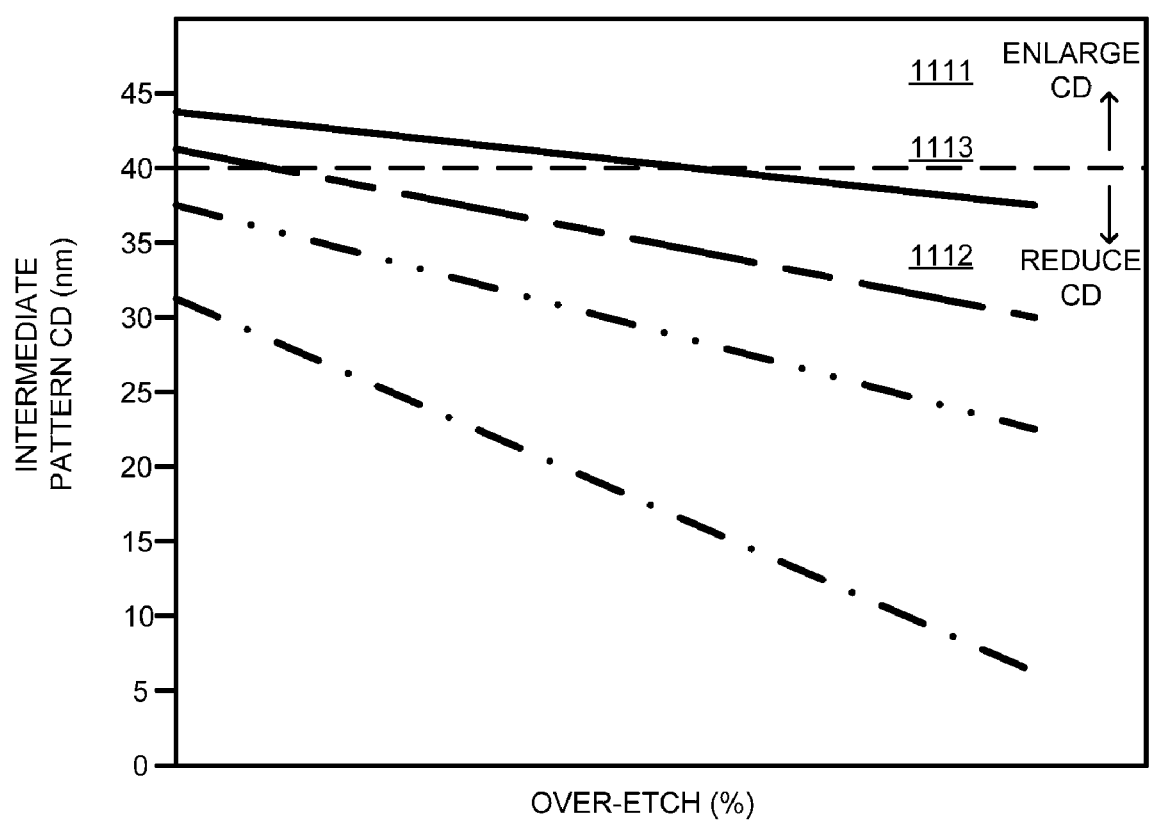

In another example, as illustrated in FIG. 11B, an OPL is patterned using a process composition containing $HBr/O_2/CO_2/He$. A parametric relationship is established between the intermediate pattern CD (nm, nanometers) and an over-etch time (represented as a fractional percentage (%) of the etch time), while holding the flow rate of $O_2/CO_2/He$ constant. The initial pattern CD and the intermediate pattern CD correspond to a line CD. The parametric relationship includes a family of data curves prepared for an initial pattern CD of 40 nm (line CD), wherein each data curve is prepared for a different flow rate of HBr, i.e., >110 sccm (solid line), 110 sccm (long dash-short dash line), 70 sccm (dash-double dot line), and 30 sccm (dash-dot line). The parametric relationship includes at least one process condition 1111, wherein the initial pattern CD is reduced to the intermediate pattern CD, and at least another process condition 1112, wherein the initial pattern CD is enlarged to the intermediate pattern CD. Further, parametric relationship includes at least yet another process condition 1113, wherein the initial pattern CD is maintained substantially the same as the intermediate pattern CD. While increasing the amount of over-etching, the process condition varies from CD enlargement to CD reduction of the line CD.

In alternate embodiments, RF power may be supplied to the upper electrode and not the lower electrode. In other alternate embodiments, RF power may be supplied to the lower electrode and not the upper electrode. In yet other alternate embodiments, RF power and/or DC power may be coupled in any of the manners described through FIGS. 4 to 10.

The time duration to perform a specific etching process may be determined using design of experiment (DOE) techniques or prior experience; however, it may also be determined using endpoint detection. One possible method of endpoint detection is to monitor a portion of the emitted light spectrum from the plasma region that indicates when a change in plasma chemistry occurs due to change or substantially near completion of the removal of a particular material layer from the substrate and contact with the underlying thin film. After emission levels corresponding to the monitored wavelengths cross a specified threshold (e.g., drop to substantially zero, drop below a particular level, or increase above a particular level), an endpoint can be considered to be reached. Various wavelengths, specific to the etch chemistry being used and the material layer being etched, may be used. Furthermore, the etch time can be extended to include a period of over-etch time, wherein the over-etch time constitutes a fraction (i.e., 1 to 100%) of the time between initiation of the etch process and the time associated with endpoint detection.

One or more of the etching processes described above may be performed utilizing a plasma processing system such as the one described in FIG. 6. However, the methods discussed are not to be limited in scope by this exemplary presentation.

Although only certain embodiments of this invention have been described in detail above, those skilled in the art will readily appreciate that many modifications are possible in the embodiments without materially departing from the novel teachings and advantages of this invention. For example, although one exemplary process flow is provided for preparing a metal gate structure, other process flows are contemplated. Accordingly, all such modifications are intended to be included within the scope of this invention.

The invention claimed is:

1. A method of patterning a multi-layer mask, comprising:
preparing a multi-layer mask on a substrate, said multi-layer mask including a lithographic layer and an intermediate mask layer underlying said lithographic layer, said intermediate mask layer comprising a carbon-containing compound;
forming a pattern in said lithographic layer, wherein said pattern is characterized by an initial pattern critical dimension (CD);
establishing an etch process recipe for transferring said pattern to said intermediate mask layer, said etch process recipe including one or more process conditions defined by one or more process parameters;
establishing at least one parametric relationship between an intermediate pattern CD to be formed in said intermediate mask layer using said etch process recipe and at least one of said one or more process parameters, wherein said at least one parametric relationship provides a first process condition for increasing said initial pattern CD to said intermediate pattern CD and a second process condition for decreasing said initial pattern CD to said intermediate pattern CD;
selecting a target process condition from said one or more process conditions using said at least one parametric relationship to achieve a target CD adjustment between said initial pattern CD and said intermediate pattern CD; and
transferring said pattern from said lithographic layer to said intermediate mask layer using said target process condition with said etch process recipe, wherein said etch process recipe includes plasma formation using a process composition containing a bromine-containing gas, an oxygen-containing gas, and an optional noble gas.

2. The method of claim 1, wherein said intermediate mask layer includes an organic planarization layer (OPL) or an organic dielectric layer (ODL).

3. The method of claim 1, wherein said intermediate mask layer contains amorphous carbon.

4. The method of claim 1, wherein said bromine-containing gas comprises HBr, $Br_2$, or $C_2H_4Br_2$, or any combination of two or more thereof.

5. The method of claim 1, wherein said bromine-containing gas consists of HBr.

6. The method of claim 1, wherein said oxygen-containing gas comprises $O_2$, CO, $CO_2$, NO, or $NO_2$, or any combination of two or more thereof.

7. The method of claim 1, wherein said process composition consists of HBr, one or more oxygen-containing gases selected from the group consisting of $O_2$ and $CO_2$, and an optional noble gas.

8. The method of claim 1, wherein said process composition consists of HBr, $O_2$, $CO_2$, and He.

9. The method of claim 1, wherein said at least one parametric relationship establishes a relationship between said intermediate pattern CD and a flow ratio between an amount of said oxygen-containing gas and an amount of said bromine-containing gas.

10. The method of claim 9, wherein said flow ratio is evaluated as a flow rate of $O_2$ divided by a flow rate of HBr.

11. The method of claim 1, wherein said initial pattern CD is decreased to said intermediate pattern CD by increasing a flow rate of said bromine-containing gas relative to a flow rate of said oxygen-containing gas.

12. The method of claim 1, wherein said initial pattern CD is increased to said intermediate pattern CD by decreasing a flow rate of said bromine-containing gas relative to a flow rate of said oxygen-containing gas.

13. The method of claim 1, further comprising:
establishing at least one second parametric relationship between a pattern roughness for said pattern in said intermediate mask layer and at least one of said one or more process parameters, wherein said at least one parametric relationship provides a process condition for reducing said pattern roughness.

14. The method of claim 13, wherein said pattern roughness includes line edge roughness (LER), or line width roughness (LWR), or a combination thereof.

15. The method of claim 1, wherein said intermediate pattern CD provide a measure for a line CD or a space CD.

16. The method of claim 15, wherein said intermediate pattern CD includes a line CD for gate patterning in front-end-of-line (FEOL) operations.

17. The method of claim 15, wherein said intermediate pattern CD includes a via or trench CD for metallization patterning in back-end-of-line (BEOL) operations.

18. The method of claim 1, wherein said multi-layer mask further includes an anti-reflective coating (ARC) layer inserted between said lithographic layer and said intermediate mask layer.

19. The method of claim 18, wherein said ARC layer includes a silicon-containing ARC layer.

20. The method of claim 1, further comprising:
over-etching said pattern in said intermediate mask layer to further adjust said intermediate pattern CD to a modified intermediate pattern CD.

* * * * *